United States Patent [19]
Allen et al.

[11] Patent Number: 6,002,292
[45] Date of Patent: Dec. 14, 1999

[54] METHOD AND APPARATUS TO CONTROL NOISE IN A DYNAMIC CIRCUIT

[75] Inventors: David Howard Allen; Daniel Lawrence Stasiak, both of Rochester, Minn.

[73] Assignee: International Business Machines Corporation, Armonk, N.Y.

[21] Appl. No.: 09/041,982

[22] Filed: Mar. 13, 1998

[51] Int. Cl.$^6$ .................................................. H03K 19/003

[52] U.S. Cl. .......................... 327/379; 327/384; 327/544; 326/21; 326/93; 326/16

[58] Field of Search ..................................... 327/379, 384, 327/205, 206, 546, 544, 545, 530; 326/21, 22, 23, 26, 93, 16

[56] References Cited

U.S. PATENT DOCUMENTS 5,748,012  5/1998  Beakes et al. .............................. 326/21

*Primary Examiner*—Dinh T. Le
*Attorney, Agent, or Firm*—Lawrence D. Maxwell

[57] ABSTRACT

A method and dynamic circuit selectively controls the amount of feedback that is supplied to the dynamic node to provide more feedback when more is needed to enhance functional operation and less feedback when less is needed to enhance performance. The additional feedback inhibits the detrimental effects of charge loss due to leakage and noise mechanisms. The circuit may, for example, selectively control the amount of feedback in response to a test signal. The test signal can be manipulated to cause the circuit to provide more feedback when the circuit is undergoing reliability stress testing and less feedback when the circuit is in normal operation as part of an electronic device.

16 Claims, 7 Drawing Sheets

METHOD AND APPARATUS TO CONTROL NOISE IN A DYNAMIC CIRCUIT

CROSS-REFERENCE TO RELATED APPLICATION

This application is related to application Ser. No. 08/861,586, filed May 22, 1997, entitled "METHOD AND APPARATUS FOR SAFE MODE IN DYNAMIC LOGIC USING DRAM CELL".

BACKGROUND OF THE INVENTION

1. Field of the Invention

The present invention relates generally to dynamic circuits and, more specifically, to dynamic logic circuits that include so-called weak feedback or keeper circuits for inhibiting noise-induced failures.

2. Description of the Related Art

Electronic logic circuits may be generally categorized into two types: static and dynamic. Static circuits include elements that, once set to one of the two binary logic states, will remain in that state essentially indefinitely, until the element is set to a different state or power to the circuit is removed. Dynamic circuits, in contrast, include elements that represent the binary logic state to which they are set by storing an electric charge in the manner of a capacitor. Because the charge typically dissipates within only a few milliseconds, a dynamic logic circuit must include a circuit for precharging it at intervals so that it maintains the logic state to which it was set until it is intentionally set to a different state. In accordance with the interval timing signals, which are generated by a suitable external clock circuit, in a typical dynamic logic circuit the charge is stored during a precharge phase and then conditionally discharged during an evaluation phase.

Defective components, charge leakage, electrical noise and other factors can cause logic circuits to fail, i.e, produce erroneous results. Dynamic logic is particularly susceptible to failure because any of a number of leakage and noise mechanisms can undesirably degrade or destroy the stored charge. As described below, so-called weak feedback circuits have been developed that inhibit noise-induced failures in dynamic logic, but they are not without disadvantages. The present invention addresses the disadvantages of prior dynamic logic circuits that include weak feedback and provides a solution.

For those readers who may not be skilled in the art to which the subject invention relates, a digital logic circuit operates in accordance with the theory of Boolean logic to enable computers and other digital electronic devices to perform mathematical computations, store data, control information flow and perform other functions. The basic units of digital logic are embodied in circuits known as gates. A gate that embodies the logical "and" function is known as an AND gate, and a gate that embodies the logical "or" function is known as an OR gate. A gate that inverts or produces the logical complement of the logic state of its input is known as a NOT gate or inverter. A gate that embodies the logical "exclusive-OR" function is known as an XOR gate. An AND gate that produces a complementary or inverted output is known as a NAND gate, and an OR gate that produces an inverted output is known as a NOR gate. A logic circuit may have one or more inputs, and a voltage can be applied to each input that represents one of the two binary logic states. The two states are referred to by the terms "high" and "low" or "1" and "0" or other contrasting terms. In response to these voltages, the logic circuit produces an output voltage that represents one of the two logic states. Whether a logic circuit interprets an input voltage as a high or low logic level depends on how much the voltage deviates from a nominal threshold level. If noise or other factors cause the voltage to deviate beyond predefined margins, the logic circuit may produce erroneous results. Extremely complex circuits, such as microprocessors, may be constructed on an integrated circuit chip that includes hundreds of thousands of these basic gates connected to one another. An erroneous output produced by even a single logic circuit may propagate through the network of interconnected logic circuits and result in total failure of the chip.

As illustrated in FIG. 1, a dynamic logic circuit 10 of the type known in the prior art as a domino circuit includes a precharge device such as a P-type field-effect transistor (PFET) 12. The gate terminal of PFET 12 is connected to the clock signal ("CLK"), the source terminal of PFET 12 is connected to the supply voltage signal ($V_{DD}$), and the drain terminal of PFET 12 is connected to an input of a logic network 14. That input of logic network 14 is referred to as the dynamic node 16. Although not specifically illustrated in FIG. 1, logic network 14 typically comprises a network of one or more interconnected N-type field-effect transistors (NFETs) that may define any suitable gate type, such as AND or OR. Logic network 14 also receives one or more other input signals ("IN") that, depending upon the topology of its internal NFET network, define the conditions under which it discharges dynamic node 16. The output of logic network 14 is connected to the source terminal of an evaluate device such as a NFET 18. The gate terminal of NFET 18 is connected to the clock signal, and its drain terminal is connected to the ground signal (i.e., zero volts with respect to $V_{DD}$). It is through NFET 18 that logic network 14 discharges dynamic node 16. A feedback or half-latch device such as another PFET 20 is connected in parallel with PFET 12, i.e., the source terminal of PFET 20 is connected to $V_{DD}$ and its drain is also connected to logic network 14. The input of an inverter 22 is connected to the dynamic node 16 of the circuit, i.e., the node at which the drain terminal of PFET 12 is connected to logic network 14. The output of inverter 22 provides the output signal ("OUT") of logic circuit 10. The output of inverter 22 is also connected to the gate terminal of PFET 20.

The leakage and noise mechanisms referred to above may include capacitive coupling to adjacent signals, charge sharing, subthreshold conduction through NFET logic transistors in logic network 14, and conduction through the NFET logic transistors due to noise on the inputs. If enough of the charge stored on dynamic node 16 is lost due to one or more of these mechanisms, the output of logic circuit 10 will transition to the incorrect state. This error can propagate to other gates (not shown) to which logic circuit 10 may be connected and cause a complete failure of a complex integrated circuit chip. To inhibit such charge loss on dynamic node 16, PFET 20 functions as a feedback device to feed back charge to dynamic node 16. The feedback is commonly referred to as "weak" because it is designed to be just barely sufficient to counter the expected charge loss due to the above-described effects.

Although the inclusion of a weak feedback circuit in logic circuit 10 addresses the charge loss problem, it adversely affects the performance of logic circuit 10. In the evaluation phase of operation, logic network 14 not only must discharge dynamic node 16 but also is forced to counter the charge supplied by PFET 16, increasing the time for dynamic node 16 to discharge. The discharge time is proportional to the size (i.e., current capacity) of the feedback device. It is not until the output of logic circuit 10 reaches a sufficiently high voltage level to turn off PFET 20 that PFET 20 stops providing charge, and this delay can adversely affect the operating speed any circuit that includes logic circuit 10.

To attempt to both minimize this delay and still inhibit charge loss, the designer of a dynamic circuit must consider the tradeoff between the potential impact on performance of providing substantial feedback by sizing the feedback device larger and the potential impact on reliability of not providing sufficient feedback by sizing the feedback device too small. Moreover, that variation in environmental conditions can be expected dictates that a designer design for the worst-case situation. For example, in reliability testing, circuits are subjected to higher voltages and temperatures than those under which they would normally be required to operate in order to stress the circuit and accelerate early failures. Typically, circuits undergoing reliability stress testing under such severe conditions are expected to operate at a much lower speed than at normal temperatures and voltage levels because such testing is intended to test logical functionality rather than speed. Thus, a circuit is considered to have passed the test so long as it exhibits the requisite logical functionality, regardless of whether it may operate at a lower speed under test than would be required or expected under normal operation.

Since higher temperatures and voltages can aggravate leakage and noise mechanisms, the designer typically includes a greater amount of feedback than is required for normal operation to ensure that the circuits remain functional under the most severe conditions. As discussed above, including a large amount of feedback in a dynamic circuit degrades performance, not only under stress conditions where high performance is not required, but also under normal conditions where high performance is paramount.

It would be desirable to provide a dynamic circuit that optimizes both functional operation and performance. These problems are satisfied by the present invention in the manner described below.

SUMMARY OF THE INVENTION

The present invention relates to a method and dynamic circuit that selectively controls the amount of feedback that is supplied to the dynamic node to provide more feedback when more is needed to enhance functional operation and less feedback when less is needed to enhance performance. The additional feedback inhibits the detrimental effects of charge loss due to leakage and noise mechanisms. The circuit may, for example, selectively control the amount of feedback in response to a selection signal that represents a test mode. The selection signal can be manipulated to cause the circuit to provide more feedback when the circuit is undergoing reliability stress testing and less feedback when the circuit is in normal operation as part of an electronic device.

The dynamic logic circuit may be formed on an integrated circuit chip and may include a precharge circuit coupled to the dynamic node, a logic network coupled to the dynamic node that conditionally discharges the dynamic node in response to logic states of its inputs, and a weak feedback circuit that includes a supplemental charge circuit. The supplemental charge circuit includes a selector input for receiving a selection signal generated externally to the dynamic logic circuit. The dynamic logic circuit may be formed of any suitable elements, such as field-effect transistors (FETs).

In certain embodiments of the invention, the supplemental charge circuit provides more feedback current to the dynamic node in response to a digital selection signal when the selection signal is in a first state or voltage range than when the selection signal is in a second state or voltage range. For example, the supplemental charge circuit may provide more feedback current to the dynamic node in response to a selection signal that represents a test mode than in response to a selection signal that represents a normal operation mode. Thus, the chip manufacturer may test the chip under stress conditions, e.g., higher voltages and temperatures than the chip would experience under normal operation, while applying the first selection signal that represents the test mode. The chip is more resistant to failure due to leakage, noise and other dynamic charge-loss factors because the feedback current is high in relation to the feedback current that would be applied in normal operation. When the tested chip is subsequently installed in an electronic device for use by an end-user, the selector input may be coupled to a source of the second selection signal that represents the normal operation mode. When the end-user operates the device ("normal operation") the second selection signal that represents the normal operation mode is applied to the selector input. This fosters high chip performance because the feedback current is low in relation to the feedback current that would be applied when the chip is under test. Performance may be maximized by designing the circuit to provide feedback current that is only the minimum necessary to compensate for leakage, noise and other dynamic charge-loss factors that the chip is expected to experience in normal operation.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein.

DESCRIPTION OF PREFERRED EMBODIMENTS

Figure 1:
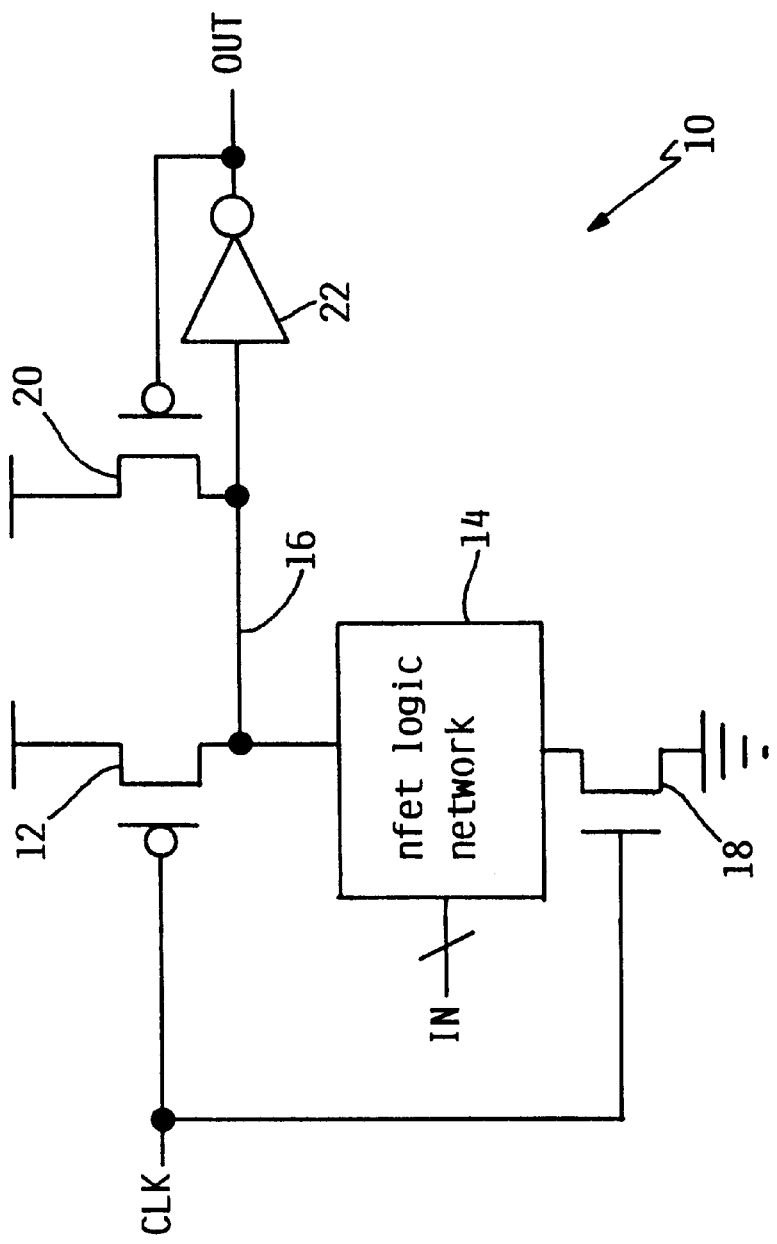
FIG. 1 is a circuit diagram illustrating a prior art dynamic logic circuit having a conventional weak feedback circuit.
Figure 2:
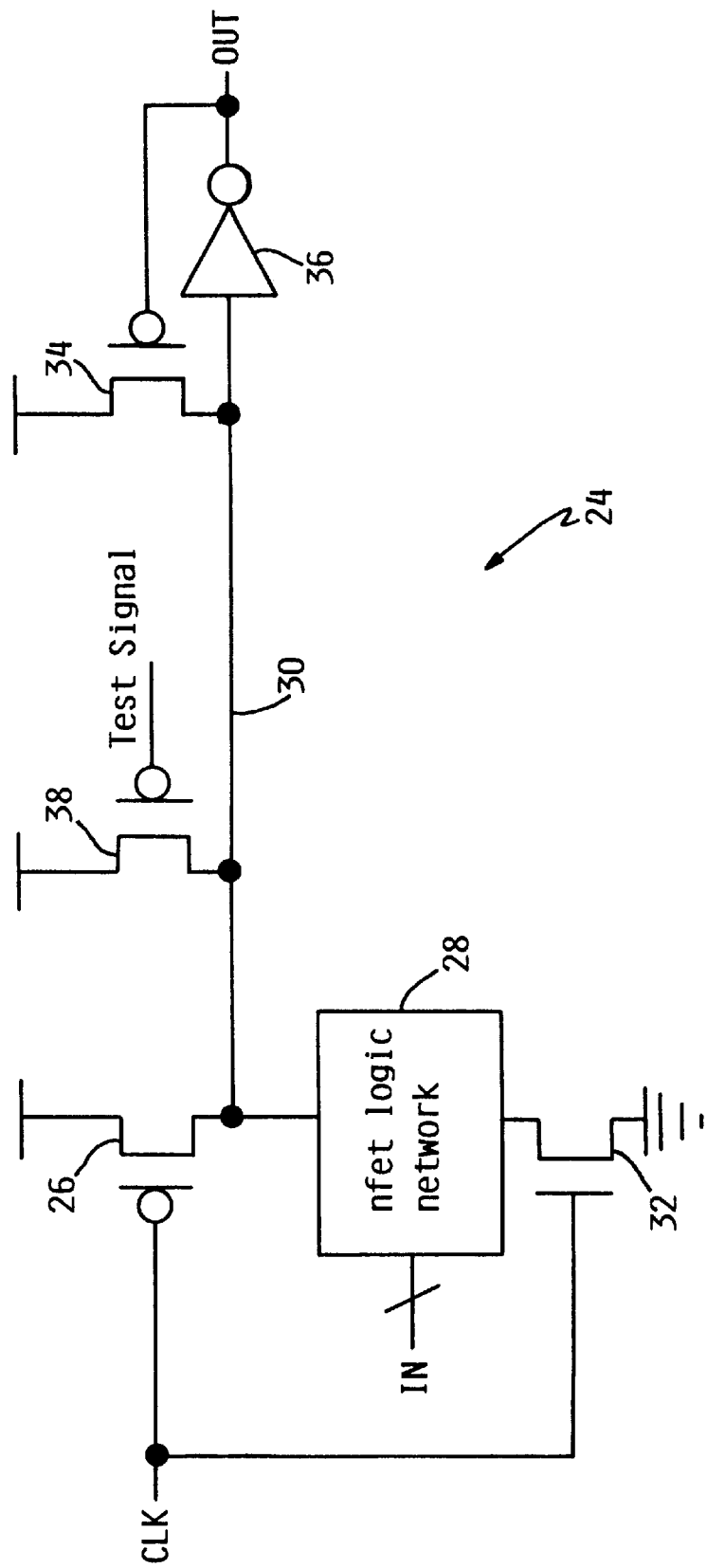
FIG. 2 is a circuit diagram illustrating a dynamic logic circuit having a weak feedback circuit that selectively controls feedback.

As illustrated in FIG. 2, a dynamic logic circuit 24 includes a precharge device such as a PFET 26. The gate terminal of PFET 26 is connected to the clock signal ("CLK"), the source terminal of PFET 26 is connected to the supply voltage signal ($V_{DD}$), and the drain terminal of PFET 26 is connected to an input of a logic network 28, which defines the dynamic node 30. Logic network 28 may comprise any suitable network of the type conventionally included in domino-type dynamic logic circuits, such as a network of one or more interconnected NFETs. Logic network 28 also receives one or more other input signals ("IN")

of the type included in a conventional domino-type dynamic logic circuit. The output of logic network 28 is connected to the source terminal of an evaluate device such as a NFET 32. The gate of NFET 32 is connected to the clock signal, and its drain terminal is connected to the ground signal. A feedback or half-latch device such as a PFET 34 is connected in parallel with PFET 26, and its gate is connected to the output signal ("OUT") of dynamic logic circuit 24. The output signal ("OUT") is produced by an inverter 36, the input of which is connected to dynamic node 30.

In addition to the above-described circuit elements, dynamic logic circuit 24 includes a supplemental charge circuit such as a PFET 38. The drain terminal of PFET 38 is connected to dynamic node 30, its source terminal is connected to the supply voltage, and its gate terminal receives a "Test Signal." The gate terminal of PFET 38 functions as a selector input for the supplemental charge circuit, and "Test Signal" functions as a selection signal that controls the amount of feedback provided to dynamic node 30. PFETS 34 and 38 together define an improved weak feedback circuit that selectively controls the amount of feedback provided to dynamic node 30. When "Test Signal" is at ground, then the gate-to-source voltage of PFET 38 is $-V_{DD}$ and PFET 38 is fully on. This maximizes feedback current to dynamic node 30. When "Test Signal" is at $V_{DD}$ PFET 38 is off and only PFET 34 provides feedback current to dynamic node 30. PFET 34 is selected in size and other factors as known in the art to provide only the minimum feedback current necessary to counteract the detrimental effects of charge loss that are expected to occur due to leakage, noise mechanisms and similar factors under normal operating condition. Thus, dynamic circuit 24 is more resistant to the detrimental effects of charge loss when "Test Signal" is at ground than it is when "Test Signal" is at $V_{DD}$. Nevertheless, it may be desirable under certain circumstances to set "Test Signal" to $V_{DD}$ to enhance performance. The following example illustrates such a circumstance.

Figure 6:
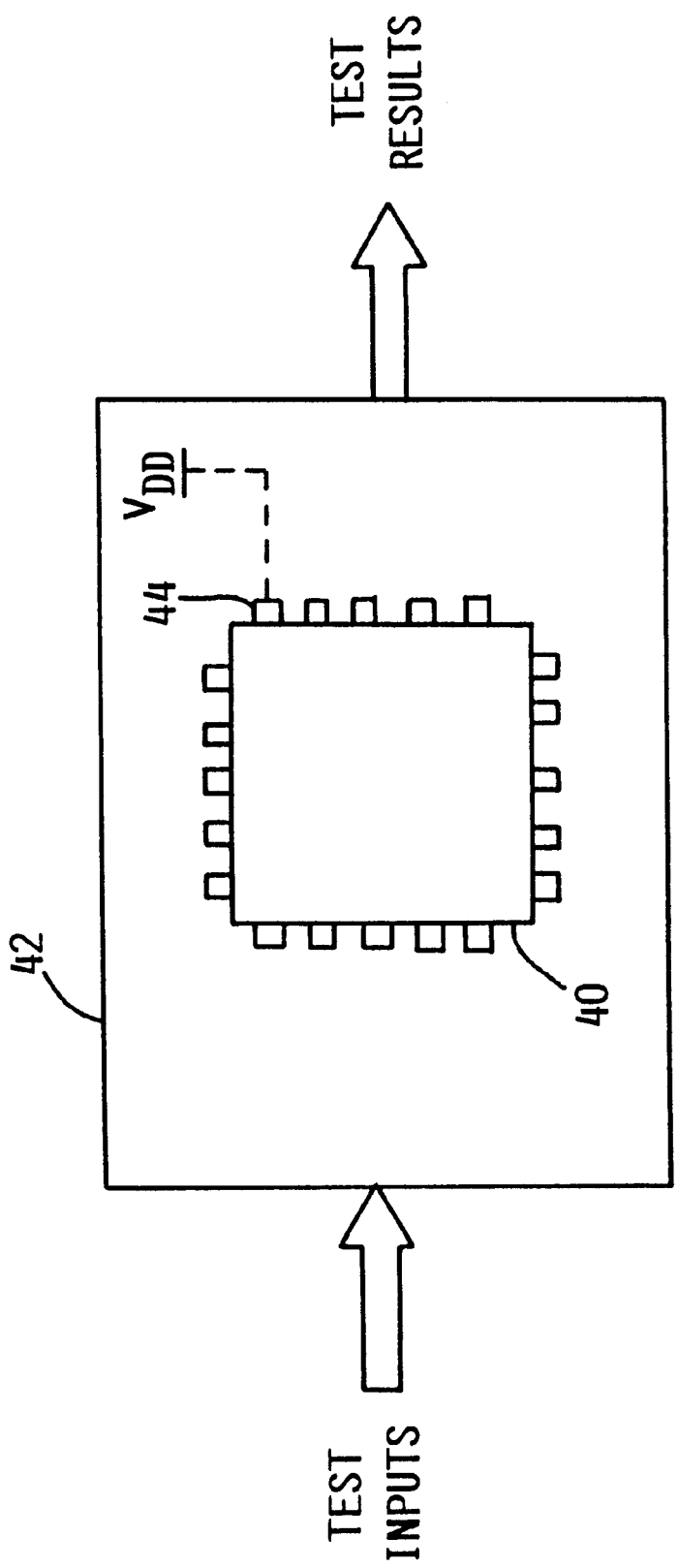
FIG. 6 illustrates testing an integrated circuit chip that includes a dynamic logic circuit having a weak feedback circuit that selectively controls feedback.

For example, dynamic logic circuit 24 may be included in an integrated circuit chip. That is, dynamic logic circuit 24 may be fabricated on a monolithic semiconductor substrate using suitable conventional microelectronic chip fabrication methods and materials. As illustrated in FIG. 6, such a chip 40 may be placed in a chip tester 42 and subjected to a conventional reliability stress test in which voltages and temperatures exceed the nominal levels expected during normal operation. This may be referred to as a "test mode" of chip 40 and its internal circuits. Chip 40 has a pin 44 that is coupled to the "Test Signal" in a suitable manner. For example, in response to the state of pin 44 a scannable test latch (not shown) could centrally generate "Test Signal," which could be distributed via suitable buffers to multiple dynamic circuits having improved weak feedback circuits as described herein. Alternatively, local copies of the signal generated by the scannable test latch could be generated, allowing local or individual control over different groups of dynamic circuits. Other alternative means for generating or coupling "Test Signal" may be suitable. In any event, the selection signal, which in these examples is named "Test Signal," refers to a signal generated externally to the dynamic logic circuit. The operator of chip tester 42 may ground pin 44 to set "Test Signal" to ground during the reliability stress test. If chip 40 fails the test, it is likely that the failure was due to a cause other than leakage or noise affecting dynamic logic circuit 24 because this method makes dynamic logic circuit 24 resistant to the detrimental effects of leakage and noise during testing.

Figure 7:
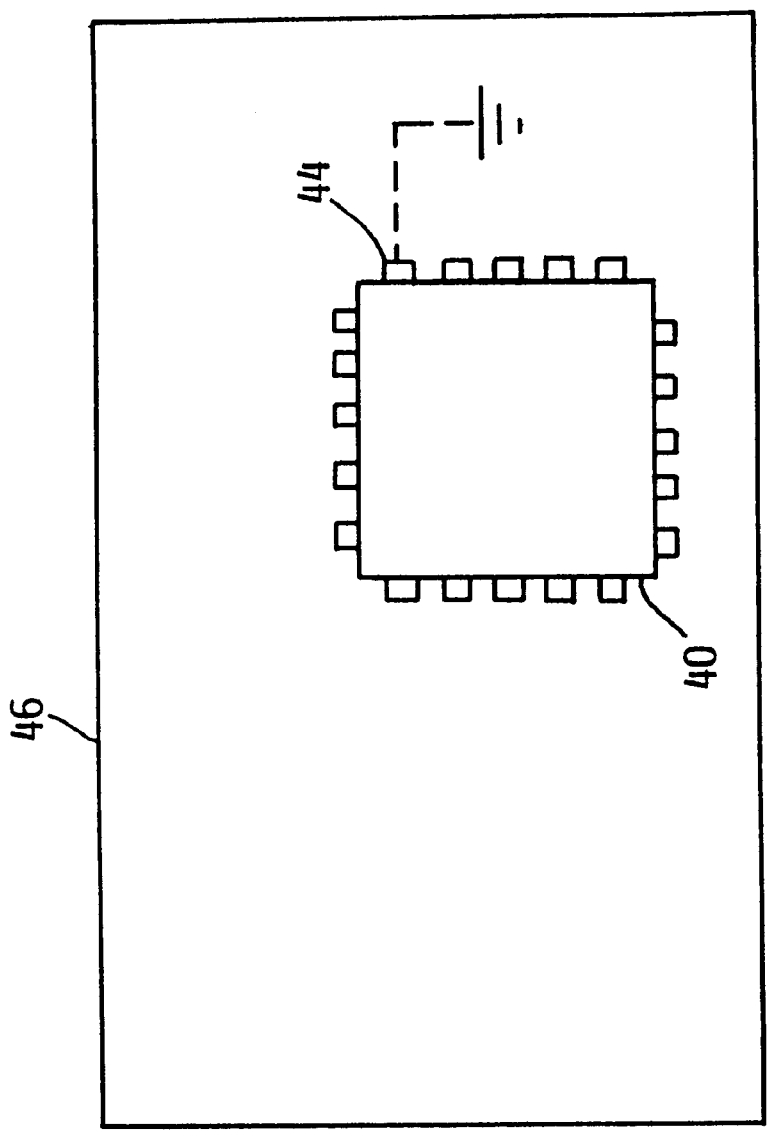
FIG. 7 illustrates normal operation in an electronic device of an integrated circuit chip that includes a dynamic logic circuit having a weak feedback circuit that selectively controls feedback.

As illustrated in FIG. 7, chip 40 may be installed in an electronic digital device 46, such as a computer. Pin 44 is connected to $V_{DD}$, but chip 40 is otherwise installed in the conventional manner. Dynamic logic circuit 24 therefore operates with minimal delay because the weak feedback circuit preferably provides only the minimum feedback current necessary to counteract the detrimental effects of charge loss that are expected to occur due to leakage, noise mechanisms and similar factors under normal operating conditions. Of course, the skilled designer may select the relative sizes of PFETs 34 and 38 to select the amount of feedback provided when "Test Signal" is at $V_{DD}$ relative to the amount of feedback provided when "Test Signal" is at ground. An end-user may use the computer or other electronic device in the normal or conventional manner, which may be referred to as the "normal operation mode" of chip 40 and its circuits.

Although the above-described example of using the dynamic circuit in a test mode versus using it in a normal operation mode illustrates one circumstance under which one may use the selection signal to selectively control feedback and the corresponding sensitivity of the dynamic circuit to leakage and noise mechanisms, more generally, the selection signal may be used to increase either performance or functional robustness of a dynamic circuit under any circumstance. Also, although in the illustrated embodiments the selection signal and corresponding feedback have two states, in other embodiments of the invention the selection signal may be an analog signal, and the amount of feedback may be continuously controllable.

Figure 3:
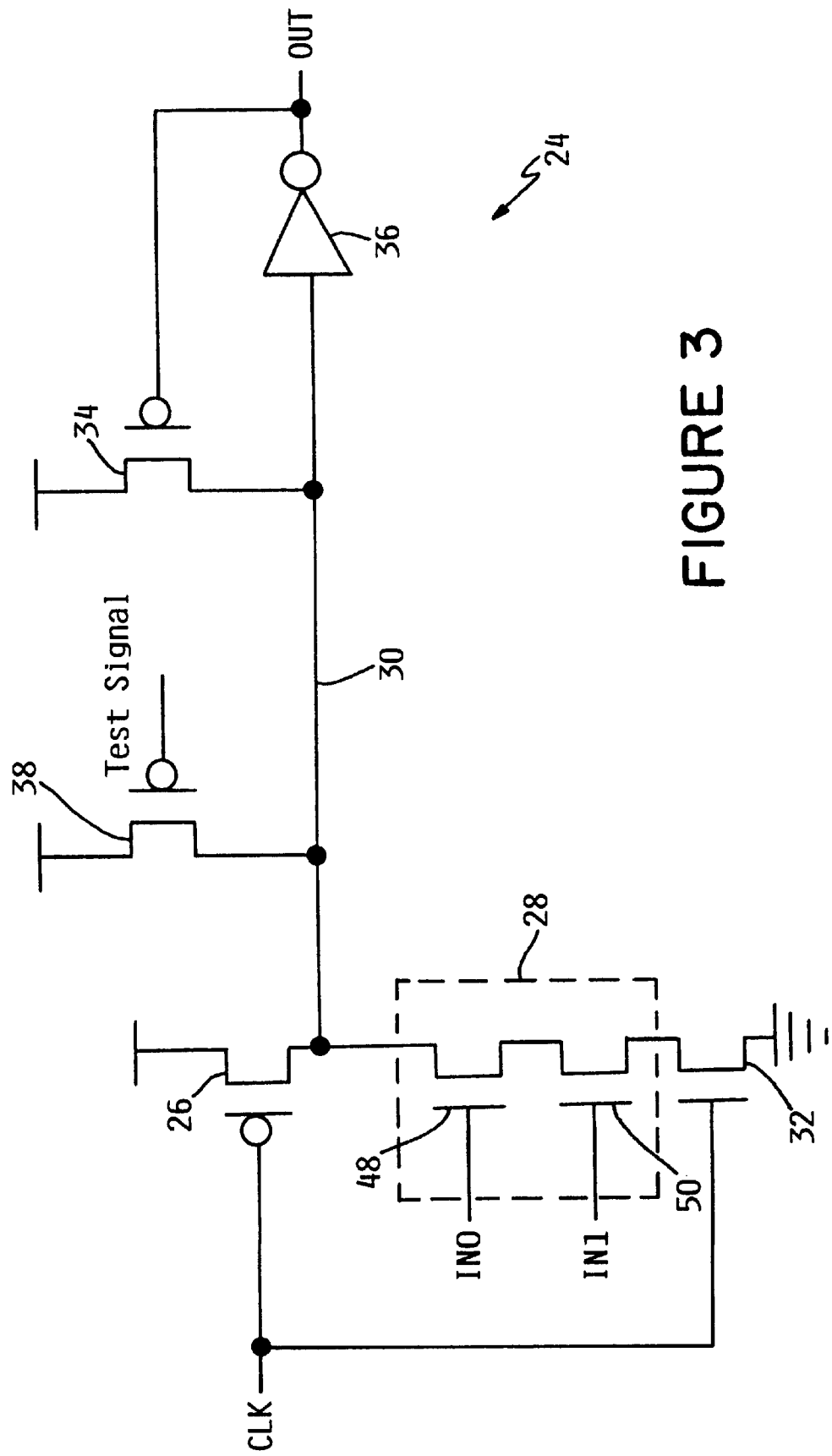
FIG. 3 is a circuit diagram illustrating a two-input dynamic AND gate having a weak feedback circuit that selectively controls feedback.

As illustrated in FIG. 3, dynamic logic circuit 24 may, for example, be a two-input AND gate fabricated in accordance with complementary metal-oxide semiconductor (CMOS) technology. FIG. 3 is similar to FIG. 2, but illustrates logic network 28 as including two NFETs 48 and 50 connected in series. The gate terminals of NFETs 48 and 50 define the inputs to logic network 28 and thus the inputs to the AND gate. In accordance with AND gate logic, the output ("OUT") of dynamic logic circuit 24 is binary "1" or "high" only if both inputs ("IN0" and "IN1") are "1" or "high." Persons skilled in the art to which the invention relates will readily appreciate that logic network 28 may be designed as known in the art to configure dynamic logic circuit 24 not only as a two-input CMOS AND gate but alternatively as an OR or any other suitable basic gate or complex gate known in the art having any number of inputs and fabricated in accordance with any suitable semiconductor technology.

Figure 4:
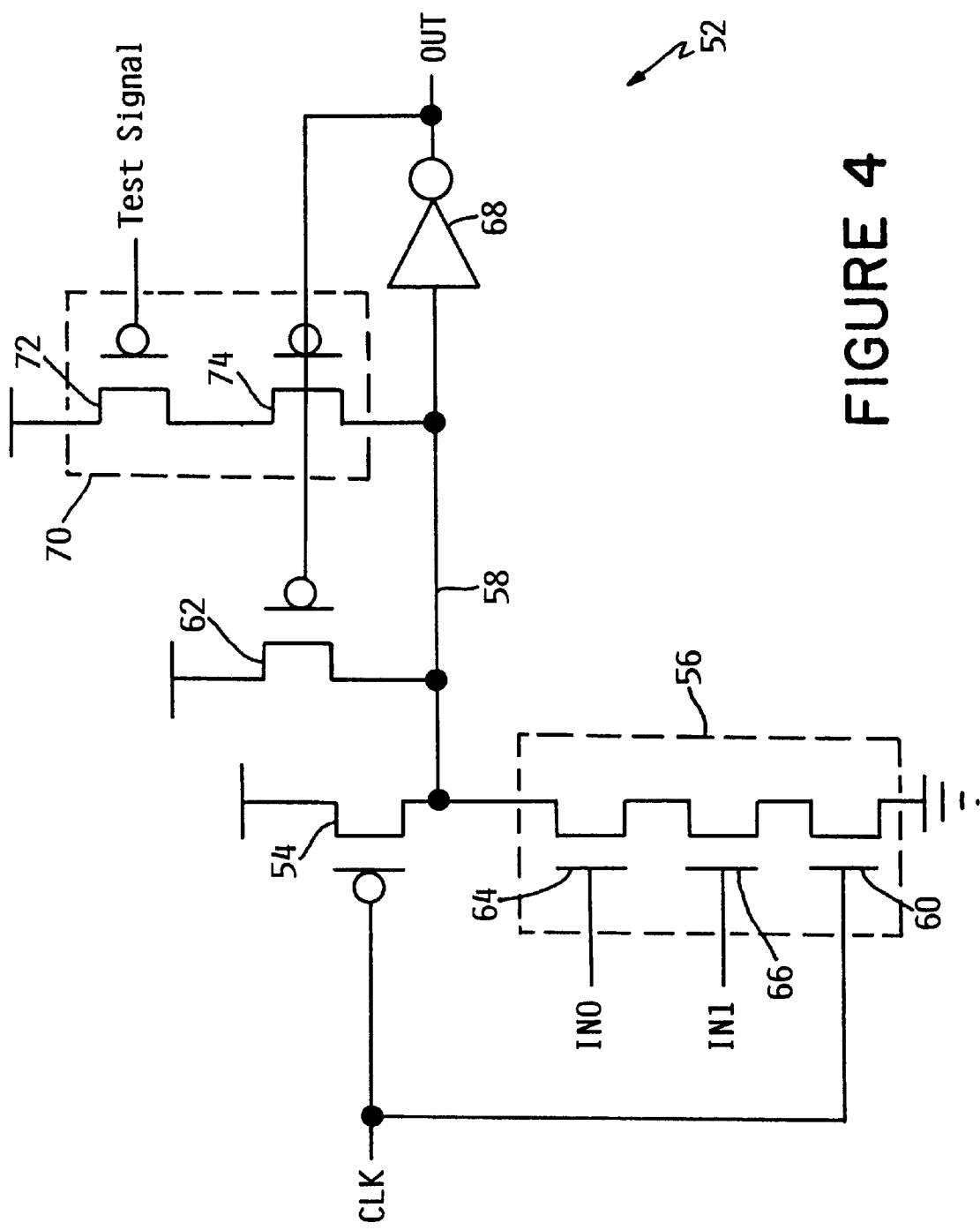
FIG. 4 is a circuit diagram illustrating a two-input dynamic AND gate having an alternative weak feedback circuit that selectively controls feedback.

As illustrated in FIG. 4, an alternative dynamic logic circuit 52 includes a precharge device such as a PFET 54, a logic network 56 having an input that defines a dynamic node 58, an evaluate device such a NFET 60, and a feedback circuit such as another PFET 62. Logic network 56 may define, for example, a two-input AND gate, and thus may include two NFETs 64 and 66 connected in series. The output signal ("OUT") of dynamic logic circuit 52 is produced by an inverter 68, the input of which is connected to dynamic node 58. These elements are coupled to one another and receive input signals "CLK", "IN0" and "IN1" in a manner directly analogous to that described above with respect to the embodiment illustrated in FIG. 3.

In addition to the above-described circuit elements, dynamic logic circuit 52 includes a supplemental charge circuit 70 such as two PFETs 72 and 74. The drain terminal of PFET 74 is connected to dynamic node 30, its source terminal is connected to the drain terminal of PFET 72, and its gate terminal is connected to the output of inverter 68. The source terminal of PFET 72 is connected to the supply voltage, and its gate terminal receives the "Test Signal." (Note that, equivalently, the gate terminal of PFET 74 could receive the "Test Signal," and the gate terminal of PFET 72 could be connected to the output of inverter 68.) PFETS 62, 72 and 74 together define an improved weak feedback circuit that selectively controls the amount of feedback provided to dynamic node 58. As in the embodiment described above with respect to FIG. 3, the gate terminal of PFET 72 functions as a selector input for supplemental charge circuit 70, and "Test Signal" functions as a selection signal that controls the amount of feedback provided to dynamic node 58. Nevertheless, this embodiment inhibits a direct current (DC) path from $V_{DD}$ to ground that can exist in dynamic logic circuit 24 (FIG. 3) when "Test Signal" is at ground and dynamic logic circuit 24 is in its evaluation phase of operation. The DC path can exist because logic network 28 pulls dynamic node 30 to ground, but until the voltage at dynamic node 30 decreases to a level sufficiently close to ground to cause inverter 36 to transition its output, PFET 38 continues to supply current to dynamic node 30. Thus, a weak DC path from $V_{DD}$ to ground may exist for a time that may be undesirable in certain circuits in which the dynamic circuit is to be included. For example, in a circumstance in which many dynamic logic circuits 24 (in a chip, potentially hundreds of thousands) are included in a circuit that is required to consume very little power (e.g., a circuit in a battery operated portable electronic device) or in a circuit in which a quiescent current (standby current) screen is used to detect defects, the combined effect of the DC paths of the many such dynamic logic circuits 24 can drain significant current.

The embodiment illustrated in FIG. 4 inhibits the above-described potentially undesirable DC path in the following manner. In normal operation, when precharge node 58 is precharged high, and the inputs ("IN0" and "IN1") to logic network 56 are such that logic network 56 does not in response discharge precharge node 58, the output signal ("OUT") remains low, and PFETs 62 and 74 are fully on and acting in series with each other. "Test Signal" will be at $V_{DD}$, however, and PFET 72 will be off, conducting no current. Therefore, PFETS 62 and 74 provide a small amount of capacitance to precharge node 58 and the output signal ("OUT") and no DC current that would fight the attempt by logic network 56 to pull precharge node 58 to ground after the output signal has gone high. Under circumstances in which more feedback is required, such as when dynamic logic circuit 52 is in a test mode, "Test Signal" will be at ground and PFET 72 can conduct additional current. Regardless of the state of "Test Signal," if the inputs ("IN0" and "IN1") to logic network 56 are such that logic network 56 in response attempts to discharge precharge node 58, the output signal ("OUT") eventually goes high and causes PFETs 62 and 74 to stop conducting entirely. At that time, no DC path between $V_{DD}$ and ground exists and, accordingly, the current is essentially zero.

Dynamic logic circuit 52 may be used in a test mode and normal operation mode in the manner described above with respect to FIGS. 6 and 7.

Figure 5:
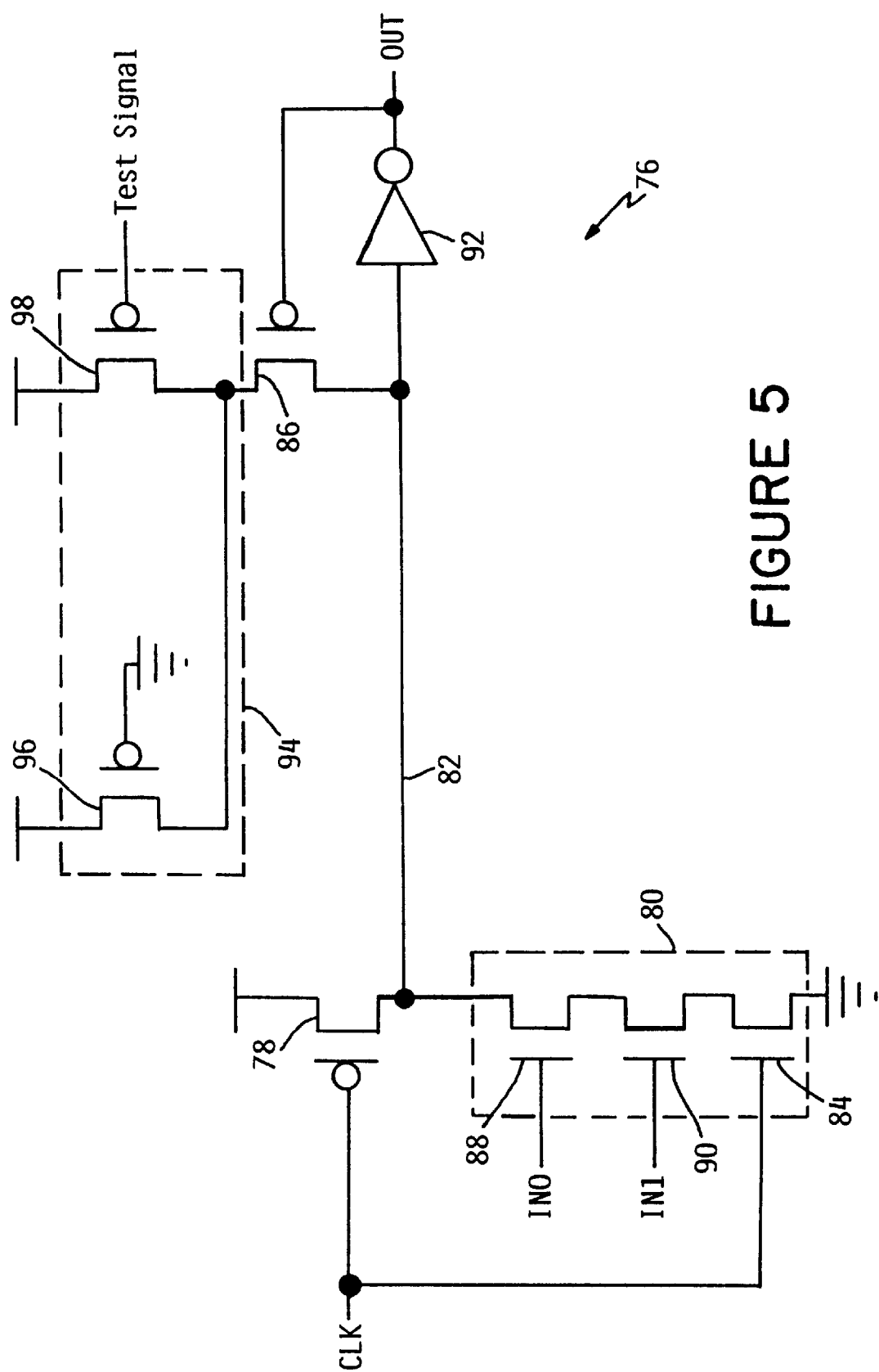
FIG. 5 is a circuit diagram illustrating a two-input dynamic AND gate having another alternative weak feedback circuit that selectively controls feedback.

As illustrated in FIG. 5, another alternative dynamic logic circuit 76 includes a precharge device such as a PFET 78, a logic network 80 having an input that defines a dynamic node 82, an evaluate device such a NFET 84, and a feedback circuit such as another PFET 86. Logic network 80 may define, for example, a two-input AND gate, and thus may include two NFETs 88 and 90 connected in series. The output signal ("OUT") of dynamic logic circuit 76 is produced by an inverter 92, the input of which is connected to dynamic node 82. These elements are coupled to one another and receive input signals "CLK", "IN0" and "IN1" in a manner directly analogous to that described above with respect to the embodiments illustrated in FIGS. 3 and 4.

In addition to the above-described circuit elements, dynamic logic circuit 76 includes a supplemental charge circuit 94 such as two PFETs 96 and 98. The source terminal of PFET 86 is connected to the drain terminals of both PFET 96 and PFET 98. The source terminal of PFET 96 is connected to the supply voltage, and its gate terminal is connected to ground. The source terminal of PFET 98 is connected to the supply voltage, and its gate terminal receives the "Test Signal." PFETS 86, 96 and 98 together define an improved weak feedback circuit that selectively controls the amount of feedback provided to dynamic node 82. As in the embodiments described above with respect to FIGS. 3 and 4, the gate terminal of PFET 98 functions as a selector input for supplemental charge circuit 94, and "Test Signal" functions as a selection signal that controls the amount of feedback provided to dynamic node 82. Nevertheless, the capacitance that the weak feedback circuit adds to precharge node 82 in this embodiment is less than that which the weak feedback circuit adds to precharge node 58 in the embodiment described above with respect to FIG. 4. Therefore, this embodiment may be more desirable under certain circumstances.

Preferably, PFET 86 is as small as practical to minimize the capacitance it contributes to precharge node 82. A larger PFET 96 can be included to compensate for the relatively small size of PFET 86 such that PFETs 86 and 96 in combination contribute sufficient current to inhibit the detrimental effects of charge loss that are expected to occur due to leakage, noise mechanisms and similar factors under normal operating conditions. PFET 98 can be as large as necessary to inhibit the detrimental effects of charge loss that are expected to occur under more severe conditions, such as reliability stress testing.

Other embodiments and modifications of the present invention will occur readily to those of ordinary skill in the art in view of these teachings. For example, although in the illustrated embodiments the dynamic circuit is a dynamic logic circuit, the invention may be embodied in other types of dynamic circuits. Furthermore, although the illustrated embodiments of the dynamic logic circuit are of the so-called domino type, the invention may be embodied in logic circuit types having other topologies and that may be constructed of other types of transistors. Therefore, this invention is to be limited only by the following claims, which include all such other embodiments and modifications when viewed in conjunction with the above specification and accompanying drawings.

What is claimed is:

1. A dynamic logic circuit, comprising:
   a precharge circuit coupled to a dynamic node;
   a logic network coupled to said dynamic node and having one or more inputs, said logic network conditionally discharging said dynamic node in response to logic states of said inputs; and
   a weak feedback circuit having an output coupled to said dynamic node providing feedback current to said dynamic node, said weak feedback circuit including a supplemental charge circuit having a selector input receiving a selection signal generated externally to said dynamic logic circuit and an output coupled to said dynamic node, said supplemental charge circuit selectively boosting said feedback current in response to said selection signal, said weak feedback circuit comprising:
      a first field-effect transistor (FET) having a first terminal coupled to said dynamic node and a second terminal coupled to said output of said weak feedback circuit; and
      a second FET having a first terminal coupled to a third terminal of said first FET and having a second terminal defining said selector input.

2. The dynamic logic circuit recited in claim 1, wherein said weak feedback circuit further comprises a third FET having a terminal coupled to said first terminal of said second FET and said third terminal of said first FET, said second and third FETs together defining said supplemental charge circuit.

3. The dynamic logic circuit recited in claim 2, wherein:
said first FET is a PFET having a drain terminal coupled to said dynamic node and a gate terminal coupled to said output of said weak feedback circuit;
said second FET is a PFET having a source terminal coupled to a supply voltage, a drain terminal coupled to a source terminal of said first FET, and a gate terminal defining said selector input; and
said third FET is a PFET having a source terminal coupled to said supply voltage, a drain terminal coupled to said source terminal of said first FET and said drain terminal of said second FET, and a gate terminal coupled to ground.

4. The dynamic logic circuit recited in claim 3, wherein:
said precharge device is a PFET having a drain terminal coupled to said dynamic node, a source terminal coupled to said supply voltage, and a gate terminal receiving a clock signal;
said logic network comprises one or more N-type FETs (NFETs); and
said improved dynamic logic circuit further comprises an evaluation circuit comprising a NFET having a source terminal coupled to said logic network, a drain terminal coupled to ground, and a gate terminal receiving said clock signal.

5. A dynamic logic circuit, comprising:
a precharge circuit coupled to a dynamic node;
a logic network coupled to said dynamic node and having one or more inputs, said logic network conditionally discharging said dynamic node in response to logic states of said inputs; and
a weak feedback circuit having an output coupled to said dynamic node providing feedback current to said dynamic node, said weak feedback circuit including a supplemental charge circuit having a selector input receiving a selection signal generated externally to said dynamic logic circuit and an output coupled to said dynamic node, said supplemental charge circuit selectively boosting said feedback current in response to said selection signal, said weak feedback circuit comprising:
a first field-effect transistor (FET) having a first terminal coupled to said dynamic node and a second terminal coupled to said output of said weak feedback circuit;
a second FET having a first terminal coupled to a third terminal of said first FET and having a second terminal defining said selector input; and
a third FET having a first terminal coupled to said dynamic node and a second terminal coupled to said output of said weak feedback circuit, said first and second FETs defining said supplemental charge circuit.

6. The dynamic logic circuit recited in claim 5, wherein:
said first FET is a PFET having a drain terminal coupled to said dynamic node and a gate terminal coupled to said output of said weak feedback circuit;
said second FET is a PFET having a source terminal coupled to a supply voltage, a drain terminal coupled to a source terminal of said first FET, and a gate terminal defining said selector input; and
said third FET is a PFET having a source terminal coupled to said supply voltage, a drain terminal coupled to said dynamic node, and a gate terminal coupled to said output of said weak feedback circuit.

7. The improved dynamic logic circuit recited in claim 6, wherein:
said precharge device is a PFET having a drain terminal coupled to said dynamic node, a source terminal coupled to said supply voltage, and a gate terminal receiving a clock signal;
said logic network comprises one or more N-type FETs (NFETs); and
said dynamic logic circuit further comprises an evaluation circuit comprising a NFET having a source terminal coupled to said logic network, a drain terminal coupled to ground, and a gate terminal receiving said clock signal.

8. An integrated circuit chip, comprising:
a precharge circuit coupled to a dynamic node, said precharge circuit fabricated on a monolithic semiconductor substrate;
a logic network coupled to said dynamic node and having one or more inputs, said logic network conditionally discharging said dynamic node in response to logic states of said inputs, said logic network fabricated on said monolithic semiconductor substrate; and
a weak feedback circuit having an output coupled to said dynamic node providing feedback current to said dynamic node, said weak feedback circuit fabricated on said monolithic semiconductor substrate, said weak feedback circuit including a supplemental charge circuit having a selector input receiving a selection signal generated externally to said chip and an output coupled to said dynamic node, said supplemental charge device selectively boosting said feedback current in response to said selection signal, said weak feedback circuit comprising:
a first field-effect transistor (FET) having a first terminal coupled to said dynamic node and a second terminal coupled to said output of said weak feedback circuit; and
a second FET having a first terminal coupled to a third terminal of said first FET and having a second terminal defining said selector input.

9. The integrated circuit chip recited in claim 8, wherein said weak feedback circuit further comprises a third FET having a terminal coupled to said first terminal of said second FET and said third terminal of said first FET, said second and third FETs defining said supplemental charge circuit.

10. The integrated circuit chip recited in claim 9, wherein:
said first FET is a PFET having a drain terminal coupled to said dynamic node and a gate terminal coupled to said output of said weak feedback circuit;
said second FET is a PFET having a source terminal coupled to a supply voltage, a drain terminal coupled to a source terminal of said first FET, and a gate terminal defining said selector input; and
said third FET is a PFET having a source terminal coupled to said supply voltage, a drain terminal coupled to said source terminal of said first FET and said drain terminal of said second FET, and a gate terminal coupled to ground.

11. The integrated circuit chip recited in claim 10, wherein:
said precharge device is a PFET having a drain terminal coupled to said dynamic node, a source terminal coupled to said supply voltage, and a gate terminal receiving a clock signal;
said logic network comprises one or more N-type FETs (NFETs); and said improved dynamic logic circuit further comprises an evaluation circuit fabricated on said monolithic semiconductor substrate, said evaluation circuit comprising a NFET having a source terminal coupled to said logic network, a drain terminal coupled to ground, and a gate terminal receiving said clock signal.

12. An integrated circuit chip, comprising:

a precharge circuit coupled to a dynamic node, said precharge circuit fabricated on a monolithic semiconductor substrate;

a logic network coupled to said dynamic node and having one or more inputs, said logic network conditionally discharging said dynamic node in response to logic states of said inputs, said logic network fabricated on said monolithic semiconductor substrate; and a weak feedback circuit having an output coupled to said dynamic node providing feedback current to said dynamic node, said weak feedback circuit fabricated on said monolithic semiconductor substrate, said weak feedback circuit including a supplemental charge circuit having a selector input receiving a selection signal generated externally to said chip and an output coupled to said dynamic node, said supplemental charge device selectively boosting said feedback current in response to said selection signal, said weak feedback circuit comprising;

a first field-effect transistor (FET) having a first terminal coupled to said dynamic node and a second terminal coupled to said output of said weak feedback circuit;

a second FET having a first terminal coupled to a third terminal of said first FET and having a second terminal defining said selector input; and a third FET having a first terminal coupled to said dynamic node and a second terminal coupled to said output of said weak feedback circuit, said first and second FETs defining said supplemental charge circuit.

13. The integrated circuit chip recited in claim 12, wherein:

said first FET is a PFET having a drain terminal coupled to said dynamic node and a gate terminal coupled to said output of said weak feedback circuit;

said second FET is a PFET having a source terminal coupled to a supply voltage, a drain terminal coupled to a source terminal of said first FET, and a gate terminal defining said selector input; and said third FET is a PFET having a source terminal coupled to said supply voltage, a drain terminal coupled to said dynamic node, and a gate terminal coupled to said output of said weak feedback circuit.

14. The integrated circuit chip recited in claim 13, wherein:

said precharge device is a PFET having a drain terminal coupled to said dynamic node, a source terminal coupled to said supply voltage, and a gate terminal receiving a clock signal;

said logic network comprises one or more N-type FETs (NFETs); and said improved dynamic logic circuit further comprises an evaluation circuit fabricated on said monolithic semiconductor substrate, said evaluation circuit comprising a NFET having a source terminal coupled to said logic network, a drain terminal coupled to ground, and a gate terminal receiving said clock signal.

15. A method for selectively controlling feedback current to a dynamic node of a dynamic circuit having a weak feedback circuit with a selector input and a feedback output coupled to said dynamic node providing feedback current to said dynamic node, the method comprising the steps of:

applying a selection signal to said selector input of said dynamic circuit; and controlling said feedback current in response to said selection signal; wherein:

said weak feedback circuit comprises a first field-effect transistor (FET), a second FET and a third FET, said first FET has a first terminal coupled to said dynamic node and a second terminal coupled to said output of said weak feedback circuit, said second FET has a first terminal coupled to a third terminal of said first FET and has a second terminal defining said selector input, and said third FET has a terminal coupled to said first terminal of said second FET and said third terminal of said first FET, and said second and third FETs together define said supplemental charge circuit; and said applying step comprises the step of applying said selection signal to said second terminal of said second FET.

16. A method for selectively controlling feedback current to a dynamic node of a dynamic circuit having a weak feedback circuit with a selector input and a feedback output coupled to said dynamic node providing feedback current to said dynamic node, the method comprising the steps of:

applying a selection signal to said selector input of said dynamic circuit; and controlling said feedback current in response to said selection signal; wherein:

said weak feedback circuit comprises a first field-effect transistor (FET), a second FET and a third FET, said first FET has a first terminal coupled to said dynamic node and a second terminal coupled to said output of said weak feedback circuit, said second FET has a first terminal coupled to a third terminal of said first FET and has a second terminal defining said selector input, and said third FET has a first terminal coupled to said dynamic node and a second terminal coupled to said output of said weak feedback circuit, said first and second FETs together define said supplemental charge circuit; and said applying step comprises the step of applying said selection signal to said second terminal of said second FET.

* * * * *